(12) United States Patent
Yong

(10) Patent No.: US 7,800,446 B2
(45) Date of Patent: Sep. 21, 2010

(54) METHOD AND SYSTEM FOR VARYING GAIN EXPONENTIALLY WITH RESPECT TO A CONTROL SIGNAL

(75) Inventor: Christopher Yong, San Diego, CA (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 12/378,520

(22) Filed: Feb. 17, 2009

(65) Prior Publication Data

US 2009/0153246 A1    Jun. 18, 2009

Related U.S. Application Data

(62) Division of application No. 11/455,983, filed on Jun. 20, 2006, now Pat. No. 7,525,380.

(51) Int. Cl.
*H03F 3/45* (2006.01)
(52) U.S. Cl. ...................................... 330/254
(58) Field of Classification Search ................. 330/254, 330/129–140, 260
See application file for complete search history.

(56) References Cited

U.S. PATENT DOCUMENTS

| | | | |
|---|---|---|---|
| 5,757,230 A | | 5/1998 | Mangelsdorf |
| 5,999,053 A | * | 12/1999 | Eschauzier ................. 330/254 |
| 6,215,989 B1 | * | 4/2001 | Otaka ...................... 455/234.1 |
| 6,600,372 B2 | * | 7/2003 | Prentice .................... 330/254 |
| 6,717,469 B2 | | 4/2004 | Maruyama et al. |
| 6,791,416 B2 | | 9/2004 | Kipnis et al. |
| 6,819,183 B1 | | 11/2004 | Zhou et al. |
| 7,551,033 B2 | | 6/2009 | Lin |

* cited by examiner

*Primary Examiner*—Robert Pascal
*Assistant Examiner*—Khiem D Nguyen

(57) ABSTRACT

A method for varying gain exponentially with respect to a control signal is provided. The method includes receiving a primary control signal. A secondary control signal is generated based on the primary control signal. The secondary control signal is provided to a variable gain amplifier and is operable to exponentially vary a gain for the variable gain amplifier with respect to the primary control signal.

20 Claims, 8 Drawing Sheets

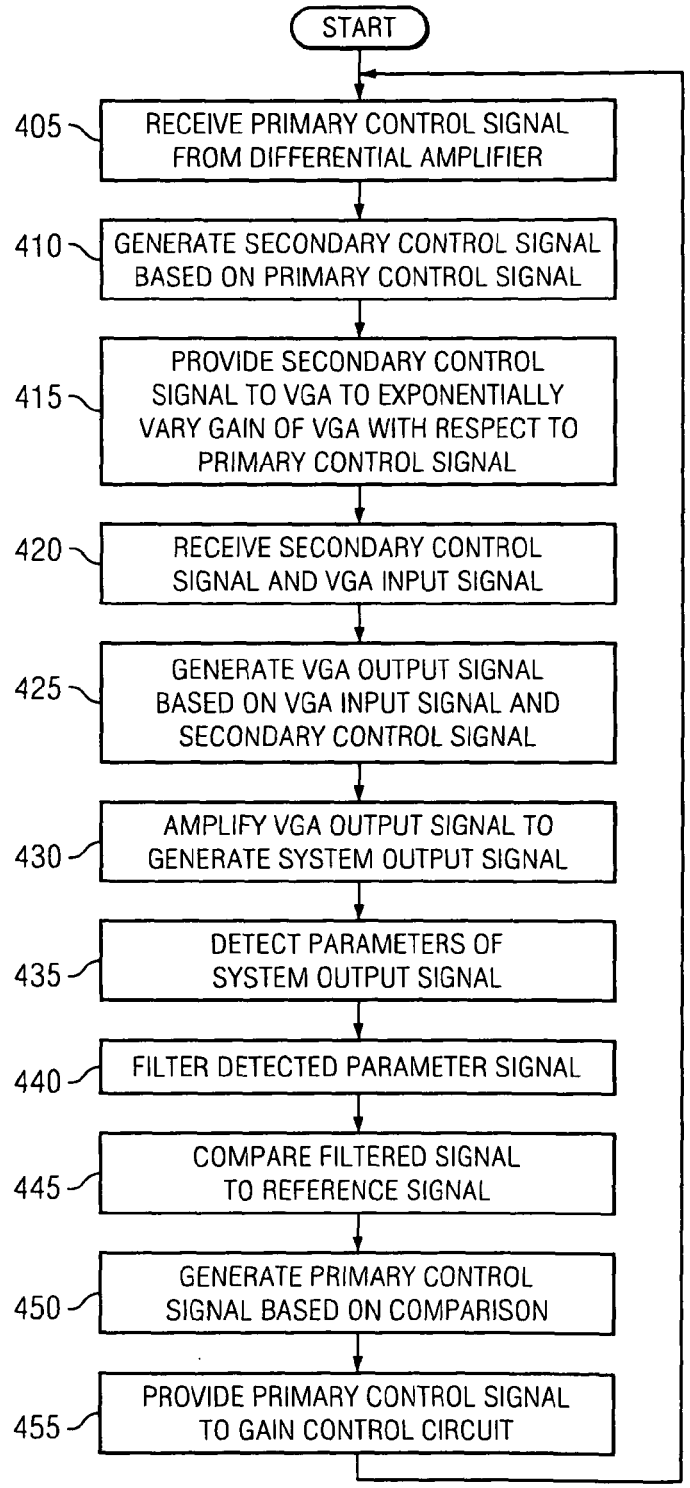

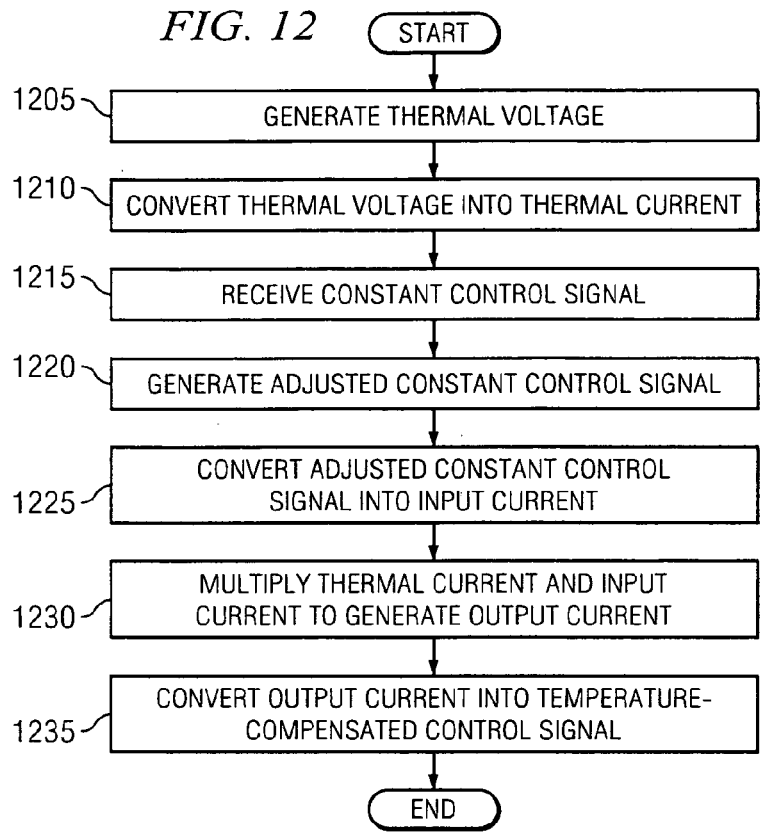
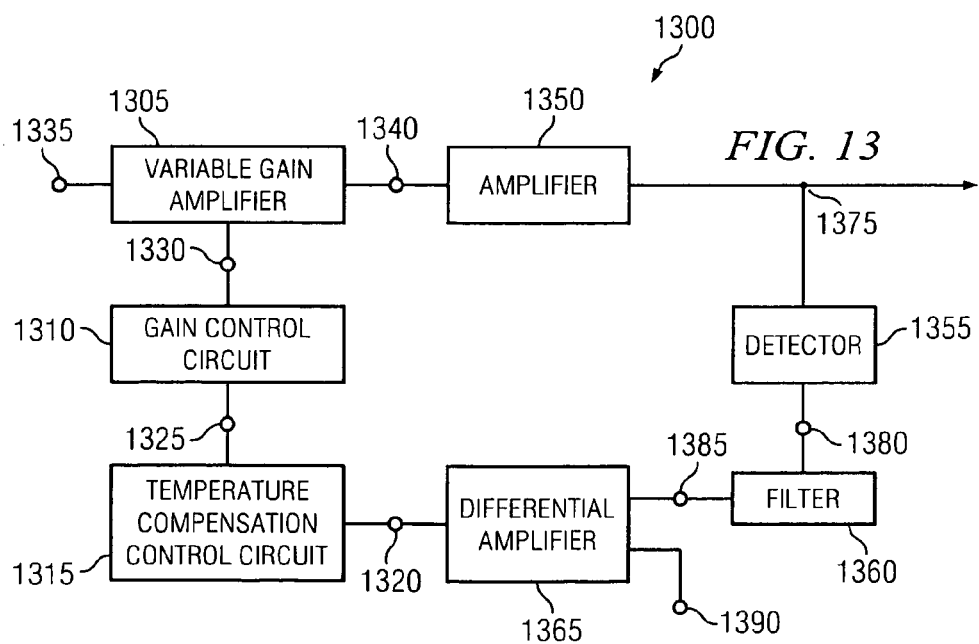

METHOD AND SYSTEM FOR VARYING GAIN EXPONENTIALLY WITH RESPECT TO A CONTROL SIGNAL

CROSS-REFERENCE TO RELATED APPLICATION

This application is a divisional of prior U.S. patent application Ser. No. 11/455,983 filed Jun. 20, 2006, now U.S. Pat. No. 7,525,380. The present application is related to U.S. patent application Ser. No. 11/471,408, titled "METHOD AND SYSTEM FOR GENERATING A TEMPERATURE-COMPENSATED CONTROL SIGNAL," filed concurrently herewith, now U.S. Pat. No. 7,439,807 the subject matter of which is hereby incorporated by reference into the present disclosure as if fully set forth herein.

TECHNICAL FIELD

This disclosure is generally directed to variable gain amplifiers and, more specifically, to a method and system for varying gain exponentially with respect to a control signal.

BACKGROUND

In wireless communication, the transmit path generally includes multiple variable gain amplifiers (VGAs). For ease of compliance with power adjustment specifications and for other system considerations, it is advantageous to be able to linearly adjust the gain (in dB) of at least one VGA in the transmit path. For some VGA designs, the exponential gain is achieved with a differential amplifier stage that provides an output current that varies exponentially in response to a differential input control voltage. The transfer function for the differential amplifier is approximately linear-in-dB but compresses at large control voltages. This may result in problems because VGAs having non-linear-in-dB transfer functions can cause degraded performance. For example, a distorted, or non-linear, transfer function may make it more difficult to set the transmit output power to a particular level with accuracy.

SUMMARY

This disclosure provides a method and system for varying gain exponentially with respect to a control signal.

In one aspect, a method includes receiving a primary control signal. A secondary control signal is generated based on the primary control signal. The secondary control signal is provided to a variable gain amplifier and is operable to exponentially vary a gain for the variable gain amplifier with respect to the primary control signal.

In another aspect, an automatic gain control system includes a variable gain amplifier and a gain control circuit. The variable gain amplifier is operable to receive a variable gain amplifier (VGA) input signal and to generate a VGA output signal based on the VGA input signal. The gain control circuit is coupled to the variable gain amplifier. The gain control circuit is operable to generate a secondary control signal based on a primary control signal and to provide the secondary control signal to the variable gain amplifier. The variable gain amplifier is further operable to generate the VGA output signal based on the secondary control signal.

In yet another aspect, a gain control circuit includes three transistors, a current-controlled voltage source, a current mirror and an input current source. The first transistor has a collector that is operable to generate an output current. The second transistor forms a differential pair with the first transistor and has an emitter coupled to an emitter of the first transistor. The current-controlled voltage source is coupled to a base of the first transistor. The third transistor is matched to the second transistor and has an emitter that is coupled to the current-controlled voltage source. The current mirror is coupled to a collector of the second transistor and to a collector of the third transistor. The input current source is coupled to the emitter of the first transistor. The gain control circuit is operable to receive a primary control signal at a base of the second transistor and a base of the third transistor and to generate a secondary control signal at the base of the first transistor and the base of the second transistor.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which:

FIG. 4 illustrates a method for varying gain exponentially with respect to a control signal using the gain control circuit of FIG. 1, 2 or 3 according to one embodiment of this disclosure;

FIG. 12 illustrates a method for generating a temperature-compensated control signal using the temperature compensation control circuit of FIG. 5 or 6 according to one embodiment of this disclosure; and FIG. 13 illustrates an automatic gain control system that is capable of varying gain exponentially with respect to a temperature-compensated control signal according to one embodiment of this disclosure.

DETAILED DESCRIPTION

FIGS. 1 through 13, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged variable gain circuit.

Figure 1:
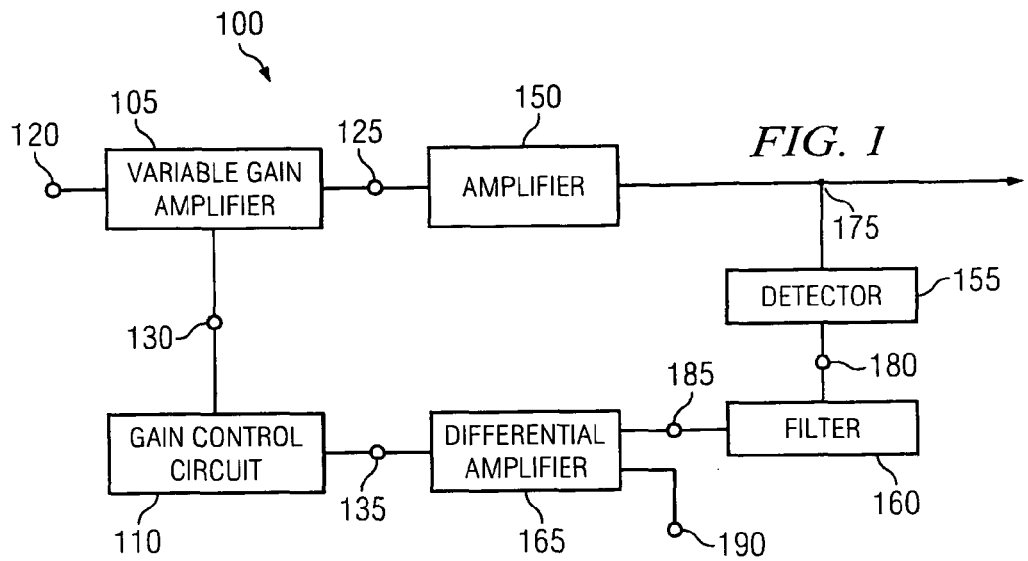
FIG. 1 illustrates an automatic gain control system that is capable of varying gain exponentially with respect to a control signal according to one embodiment of this disclosure.

FIG. 1 illustrates an automatic gain control system 100 that is capable of varying the gain of a variable gain amplifier 105 exponentially with respect to a control signal based on a modified version of that control signal received from a gain control circuit 110 according to one particular embodiment of this disclosure. For a particular embodiment, the automatic gain control system 100 may be implemented in a transmit path of a communication system. However, it will be understood that the automatic gain control system 100 may be implemented in any other suitable system without departing from the scope of the present disclosure.

The gain control circuit 110 is operable to receive a primary control signal 135 and to generate a secondary control signal 130 based on the primary control signal 135 in order to exponentially vary the gain of the variable gain amplifier 105. The variable gain amplifier 105, which is coupled to the gain control circuit 110, is operable to receive a variable gain amplifier (VGA) input signal 120 and to generate a VGA output signal 125 by amplifying the VGA input signal 120 based on the secondary control signal 130. However, the gain of the variable gain amplifier 105 varies exponentially with respect to the primary control signal 135 instead of with respect to the secondary control signal 130.

For the illustrated embodiment, the variable gain amplifier 105 and the gain control circuit 110 are part of an automatic gain control system 100 that also comprises an amplifier 150, a detector 155, a filter 160, and a differential amplifier 165. However, it will be understood that the variable gain amplifier 105 and the gain control circuit 110 may be implemented in a differently arranged automatic gain control system or in any other suitable system without departing from the scope of the present disclosure.

For this embodiment, the amplifier 150 is coupled to the variable gain amplifier 105 and is operable to further amplify the VGA output signal 125 in order to generate a system output signal 175 that is at a higher level than the VGA output signal 125 for use in an application in which the automatic gain control system 100 is implemented. The detector 155, which is coupled to the amplifier 150, is operable to detect one or more parameters associated with the system output signal 175, such as amplitude, carrier frequency, modulation index or the like, and to generate a detected parameter signal 180 based on the detection.

The filter 160, which may comprise a low-pass or other suitable filter, is coupled to the detector 155 and is operable to filter out any undesired components to generate a filtered signal 185. The differential amplifier 165 is coupled to the filter 160 and is operable to compare the filtered signal 185 to a reference signal 190 in order to generate the primary control signal 135.

The gain control circuit 110, which is coupled to the differential amplifier 165, may then generate the secondary control signal 130 based on the primary control signal 135 and exponentially vary the gain of the variable gain amplifier 105 with respect to the primary control signal 135 using the secondary control signal 130. As described in more detail, below in connection with FIGS. 2-4, the gain control circuit 110 is operable to generate the secondary control signal 130 in such a manner as to maximize the ability of the variable gain amplifier 105 to vary its gain exponentially (i.e., in a linear-in-dB fashion) with respect to the primary control signal 135.

Figure 2:
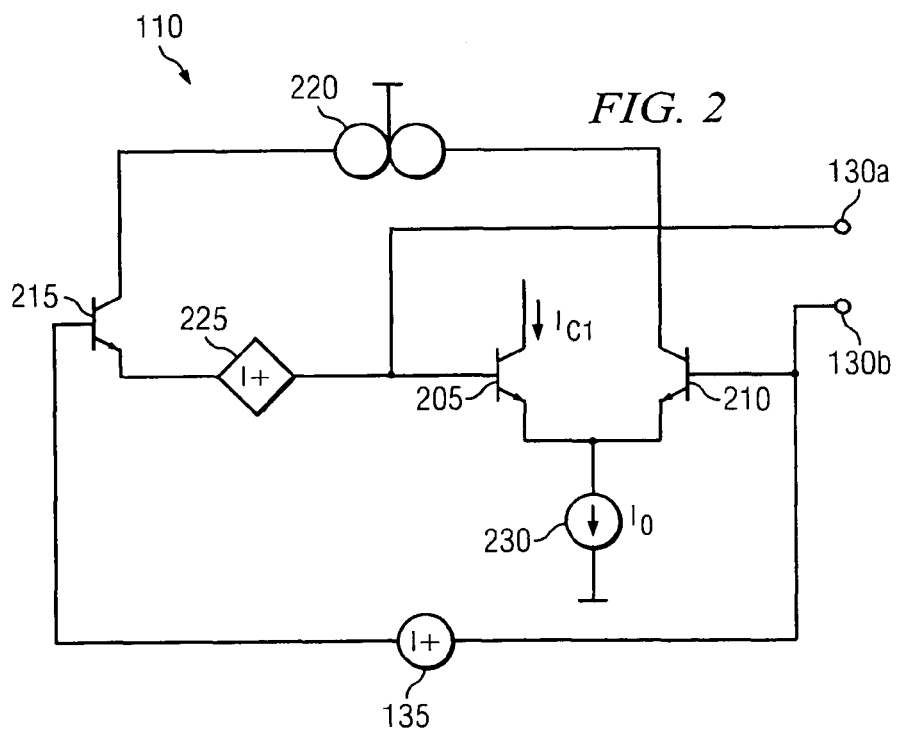
FIG. 2 illustrates a simplified circuit design of the gain control circuit of FIG. 1 according to one embodiment of this disclosure.

FIG. 2 illustrates a simplified circuit design of the gain control circuit 110 according to one embodiment of this disclosure. This embodiment of the gain control circuit 110 comprises a plurality of transistors 205, 210 and 215, a current mirror 220, a current-controlled voltage source (CCVS) 225, and a current source 230.

The primary control signal 135, or $V_{in}$, is applied across one of the transistors (transistor 205) in a differential pair (transistors 205 and 210). To accomplish this, transistor 215 is matched to transistor 210 and is biased in the opposite direction as transistor 210 in order to cancel the voltage drop across transistor 210. In addition, the output current, identified as $I_{c1}$, is normalized to the current source 230, which provides the input current identified as $I_0$.

The CCVS 225 provides a voltage, $V_c$, given by the following equation:

$$V_c = V_T \ln(I_0/I_s),$$

where $V_T$ is the thermal voltage and the transistor exponential characteristics are given by:

$$I_c = I_s e^{(V_{be}/V_T)}.$$

If $I_s = I_{in}$, $V_{be} = -V_{in}$, and $I_{out} = I_c$, then $$I_{out} = I_{in} e^{(-V_{in}/V_T)}$$

and $$A_1 = 1/e^{(V_{in}/V_T)}.$$

This relationship is provided by ensuring that $V_{in}$ appears directly across transistor 205 and biasing transistor 205 such that $I_{c1} = I_0$ when $V_{in} = 0$.

To accomplish this using the exemplary circuit of FIG. 3 (described in further detail below), first $-V_{be2}$ is added to the differential pair 205 and 210 (as part of the CCVS 225). The current-voltage relationship may then be written as:

$$I_{c1} = I_s e^{(-V_{in}/V_T)}$$

and current gain is given by:

$$A_1 = I_{c1}/I_0 = e^{((-V_{in}-V_s)/V_T)}.$$

Next, $-V_c$ is added to the circuit (also as part of the CCVS 225). The current-voltage relationship with $-V_c$ added becomes:

$$I_{c1} = I_s e^{(V_{be}/V_T)} = I_s e^{((-V_{in}+V_c)/V_T)}$$

and current gain becomes:

$$A_1 = I_{c1}/I_0 = e^{(-V_{in}/V_T)},$$

which provides the desired exponential behavior for the variable gain amplifier 105. Using this system, $V_{in} = -V_{be1} + V_c$. In addition, the secondary control signal 130 is generated at the bases of transistors 205 and 210, as indicated by the two nodes 130a and 130b.

Figure 3:
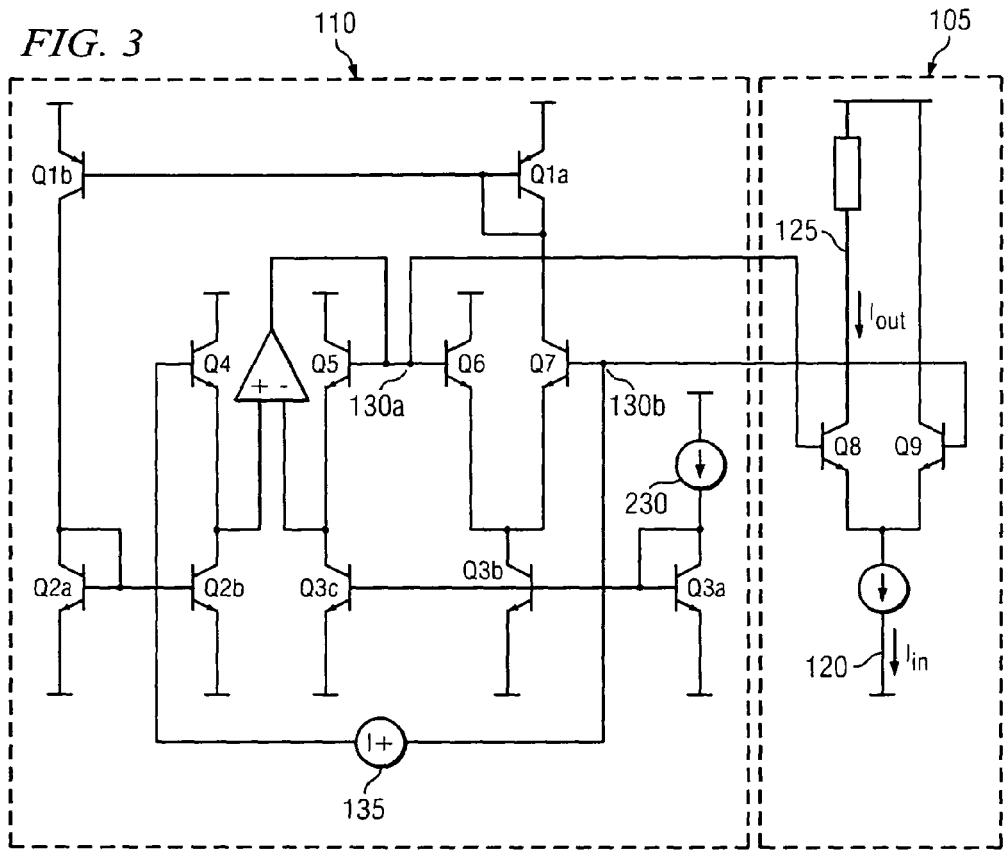
FIG. 3 illustrates a circuit diagram of the gain control circuit of FIG. 1 or 2 and the variable gain amplifier of FIG. 1 according to one embodiment of this disclosure.

FIG. 3 illustrates a circuit diagram of the variable gain amplifier 105 and the gain control circuit 110 according to one embodiment of this disclosure. For this embodiment, the gain control circuit 110 comprises a plurality of transistors, an operational amplifier and a current source.

The transistors Q1a and Q1b form a first current mirror, Q2a and Q2b form a second current mirror, and Q3a, Q3b and Q3c form a third current mirror. The transistors Q4 and Q7 are matched. For the transistors Q3a and Q5, $V_{be}$ is the same, and for the transistors Q4 and Q7, $V_{be}$ is the same.

The primary control signal 135 is applied across transistors Q4 and Q7, and the secondary control signal 130 is generated from transistors Q6 and Q7, as indicated at nodes 130a and 130b, respectively. The secondary control signal 130 is applied to the variable gain amplifier 105 at transistors Q8 and Q9.

FIG. 4 illustrates a method for exponentially varying gain in the variable gain amplifier 105 with respect to a primary control signal 135 using the gain control circuit 110 according to one embodiment of this disclosure. This embodiment corresponds to the automatic gain control system 100 illustrated in FIG. 1. However, it will be understood that portions of this embodiment may be implemented in any other suitable system without departing from the scope of the present disclosure. In addition, the embodiment of FIG. 4 arbitrarily begins with the gain control circuit 110; however, it will be understood that the method could be described beginning with any component 105, 110, 150, 155, 160 or 165 of the automatic gain control system 100 and that each component 105, 110, 150, 155, 160 or 165 performs its function essentially continuously instead of only performing its function at a specific time, as described.

The method begins at step 405 where the gain control circuit 110 receives a primary control signal 135 from the differential amplifier 165. At step 410, the gain control circuit 110 generates a secondary control signal 130 based on the primary control signal 135. For one embodiment, the gain control circuit 110 generates the secondary control signal 130 by applying the primary control signal 135 directly across one transistor (such as transistor 205 or Q6) in a differential pair of transistors (such as transistors 205 and 210 or Q6 and Q7). At step 415, the gain control circuit 110 provides the secondary control signal 130 to the variable gain amplifier (VGA) 105 in order to exponentially vary the gain of the variable gain amplifier 105 with respect to the primary control signal 135.

At step 420, the variable gain amplifier 105 receives the secondary control signal 130 from the gain control circuit 110 and receives a VGA input signal 120 from any suitable component coupled to the automatic gain control system 100. At step 425, the variable gain amplifier 105 generates a VGA output signal 125 based on both the VGA input signal 120 and the secondary control signal 130 by amplifying the VGA input signal 120 with a gain that is controlled by the secondary control signal 130.

At step 430, the amplifier 150 amplifies the VGA output signal 125 to generate a system output signal 175 for the automatic gain control system 100. At step 435, the detector 155 detects one or more parameters of the system output signal 175 to generate a detected parameter signal 180.

At step 440, the filter 160 filters the detected parameter signal 180 to generate a filtered signal 185. At step 445, the differential amplifier 165 compares the filtered signal 185 to a reference signal 190. At step 450, the differential amplifier 165 generates the primary control signal 135 based on the comparison of the filtered signal 185 to the reference signal 190. At step 455, the differential amplifier 165 provides the primary control signal 135 to the gain control circuit 110, and the method returns to step 405 where the gain control circuit 110 continues to receive the primary control signal 135.

In this way, the gain (in dB) of at least one variable gain amplifier 105 in a transmit path of a communication system may be linearly adjusted, making compliance with power adjustment specifications and other system considerations easier. The transfer function is linear-in-dB even at relatively large control voltages. This results in the variable gain amplifier 105 having an improved performance as compared to a variable gain amplifier with a gain that is adjusted only by a primary control signal from a differential amplifier. In addition, the variable gain amplifier 105 has a reduced requirement for RF calibration.

Figure 5:
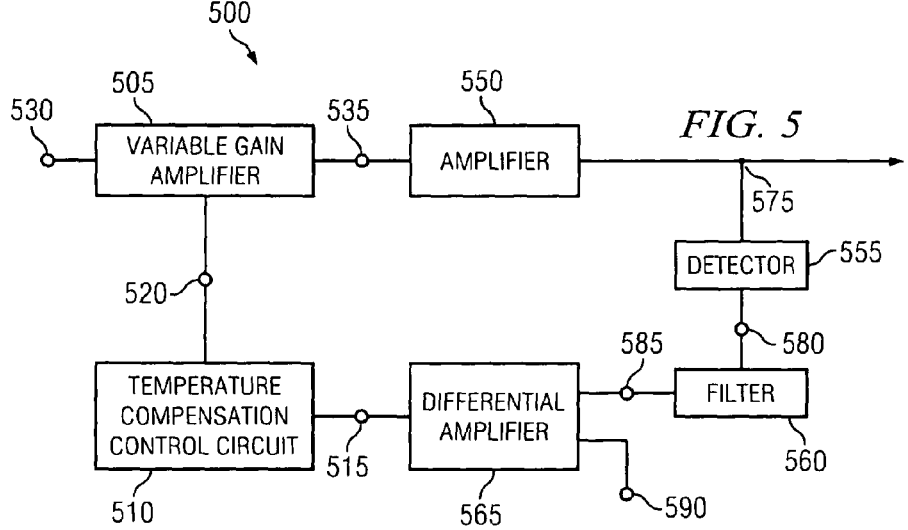
FIG. 5 illustrates an automatic gain control system that is capable of generating a temperature-compensated control signal according to one embodiment of this disclosure.

FIG. 5 illustrates an automatic gain control system 500 that is capable of generating a temperature-compensated control signal for varying the gain of a variable gain amplifier 505 according to one embodiment of this disclosure. For a particular embodiment, the automatic gain control system 500 may be implemented in a transmit path of a communication system. However, it will be understood that the automatic gain control system 500 may be implemented in any other suitable system without departing from the scope of the present disclosure.

The automatic gain control system 500 comprises a temperature compensation control circuit 510 that is coupled to the variable gain amplifier 505. The temperature compensation control circuit 510 is operable to receive a constant control signal 515 and to generate a temperature-compensated control signal 520 based on the constant control signal 515 in order to cause the variable gain amplifier 505 to function independently of temperature. As used herein, a "constant control signal" means a control signal that is not temperature-compensated. Thus, the constant control signal 515 may be altered in order to adjust the gain of the variable gain amplifier 505. However, the constant control signal 515 is not altered to compensate for temperature differences that may affect the performance of the variable gain amplifier 505.

The variable gain amplifier 505, which is coupled to the temperature compensation control circuit 510, is operable to receive a variable gain amplifier (VGA) input signal 530 and to generate a VGA output signal 535 by amplifying the VGA input signal 530 based on the temperature-compensated control signal 520.

For the illustrated embodiment, the variable gain amplifier 505 and the temperature compensation control circuit 510 are part of an automatic gain control system 500 that also comprises an amplifier 550, a detector 555, a filter 560, and a differential amplifier 565. However, it will be understood that the variable gain amplifier 505 and the temperature compensation control circuit 510 may be implemented in a differently arranged automatic gain control system or in any other suitable system without departing from the scope of the present disclosure.

For this embodiment, the amplifier 550 is coupled to the variable gain amplifier 505 and is operable to further amplify the VGA output signal 535 in order to generate a system output signal 575 that is at a higher level than the VGA output signal 535 for use in an application in which the automatic gain control system 500 is implemented. The detector 555, which is coupled to the amplifier 550, is operable to detect one or more parameters associated with the system output signal 575, such as amplitude, carrier frequency, modulation index or the like, and to generate a detected parameter signal 580 based on the detection.

The filter 560, which may comprise a low-pass or other suitable filter, is coupled to the detector 555 and is operable to filter out any undesired components to generate a filtered signal 585. The differential amplifier 565 is coupled to the filter 560 and is operable to compare the filtered signal 585 to a reference signal 590 in order to generate the constant control signal 515.

The temperature compensation control circuit 510, which is coupled to the differential amplifier 565, may then generate the temperature-compensated control signal 520 based on the constant control signal 515. As described in more detail below in connection with FIGS. 6-12, the temperature compensation control circuit 510 is operable to generate the temperature-compensated control signal 520 such that the variable gain amplifier 505 may function independently of temperature.

Figure 6:
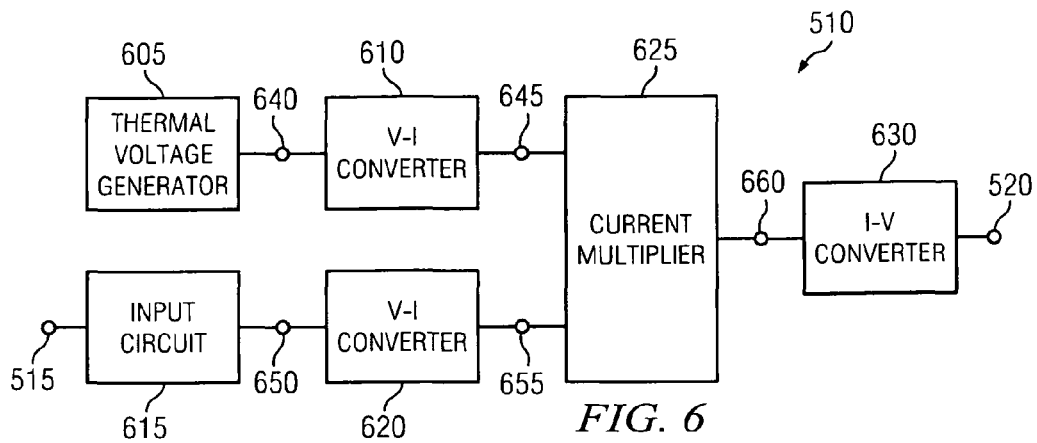
FIG. 6 illustrates a block diagram of the temperature compensation control circuit of FIG. 5 according to one embodiment of this disclosure.

FIG. 6 illustrates a block diagram of the temperature compensation control circuit 510 according to one embodiment of this disclosure. For this embodiment, the temperature compensation control circuit 510 comprises a thermal voltage generator 605, an input circuit 615, two voltage-to-current (V-I) converters 610 and 620, a current multiplier 625, and a current-to-voltage (I-V) converter 630.

The thermal voltage generator 605 is operable to generate a thermal voltage 640. The first V-I converter 610, which is coupled to the thermal voltage generator 605, is operable to convert the thermal voltage 640 into a thermal current 645. The input circuit 615 is operable to receive the constant control signal 515 and to generate an adjusted constant control signal 650 based on the constant control signal 515 by applying an offset, if desired. In generating the adjusted constant control signal 650, the input circuit 615 is operable to define a starting point for gain control. The second V-I converter 620, which is coupled to the input circuit 615, is operable to convert the adjusted constant control signal 650 into an input current 655.

The current multiplier 625, which is coupled to the V-I converters 610 and 620, is operable to multiply the thermal current 645 and the input current 655 to generate an output current 660. The I-V converter 630, which is coupled to the current multiplier 625, is operable to convert the output current 660 into the temperature-compensated control signal 520.

As described in more detail below, the thermal voltage generator 605 and the current multiplier 625 are designed to compensate for the temperature variation in the following gain control equation:

$$A_1 = 1/e^{(V_{in}/V_T)},$$

where the thermal voltage $V_T = kT/q$, by making the original $V_{in}$ (the constant control signal 515) a function of $V_T$ (the thermal voltage 640) to generate a modified $V_{in}$ (the temperature-compensated control signal 520).

Figure 7A:
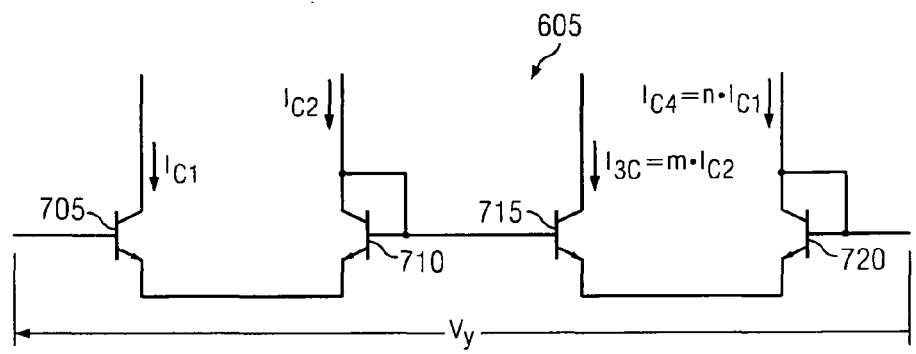
FIG. 7A illustrates a circuit diagram of the thermal voltage generator of FIG. 6 according to one embodiment of this disclosure.

FIG. 7A illustrates a circuit diagram of the thermal voltage generator 605 according to one embodiment of this disclosure. For this embodiment, the thermal voltage generator 605 comprises four transistors 705, 710, 715 and 720. Although it would be possible to use a single differential pair, such as transistors 705 and 710, the illustrated embodiment uses two differential pairs. For this embodiment, $$V_y = V_{be1} - V_{be2} + V_{be3} - V_{be4}$$
$$= V_T \ln[(I_{c1}/I_{c2})(I_{c3}/I_{c4})]$$
$$= V_T \ln[(I_{c1}/I_{c2})(mI_{c2}/nI_{c1})]$$
$$= V_T \ln(m/n),$$

where $V_y$ is the voltage across the bases of transistors 705 and 720, as illustrated in FIG. 7A, $V_{be1}$ is the base-emitter voltage for transistor 705, $V_{be2}$ is the base-emitter voltage for transistor 710, $V_{be3}$ is the base-emitter voltage for transistor 715, and $V_{be4}$ is the base-emitter voltage for transistor 720.

Figure 7B:
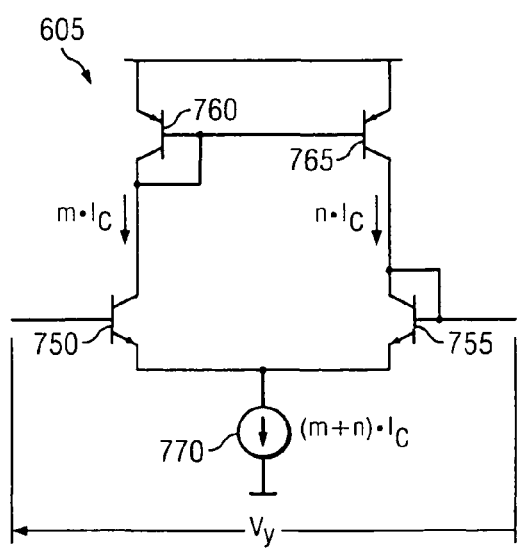
FIG. 7B illustrates a circuit diagram of the thermal voltage generator of FIG. 6 according to another embodiment of this disclosure.

FIG. 7B illustrates a circuit diagram of the thermal voltage generator 605 according to another embodiment of this disclosure. For this embodiment, the thermal voltage generator 605 comprises four transistors 750, 755, 760 and 765 and one current source 770. The device size ratio of transistor 760 compared to transistor 765 is m:n and the current source 770 provides a current of $(m+n)I_c$. Thus, $$V_y = V_{be1} - V_{be2}$$
$$= V_T \ln(m/n),$$

where $V_y$ is the voltage across the bases of transistors 750 and 755, as illustrated in FIG. 7B, $V_{be1}$ is the base-emitter voltage for transistor 750, and $V_{be2}$ is the base-emitter voltage for transistor 755.

Figure 8A:
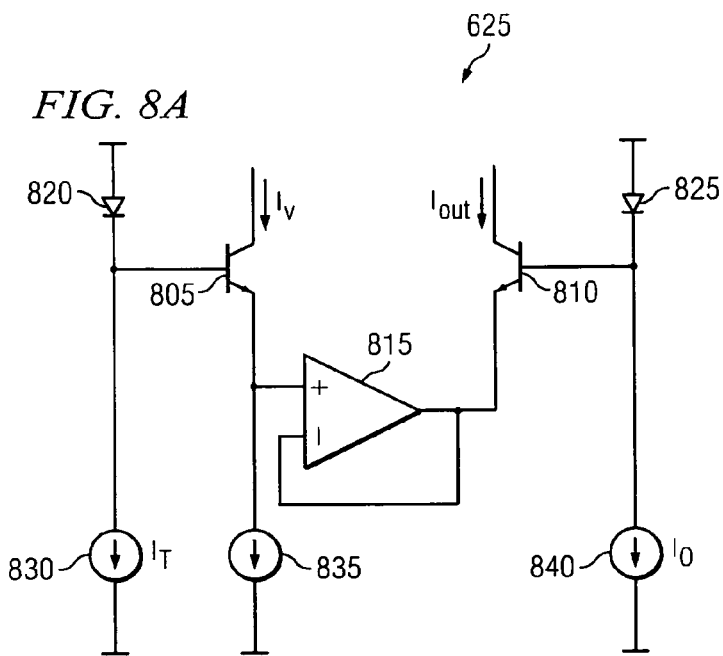
FIG. 8A illustrates a circuit diagram of the current multiplier of FIG. 6 according to one embodiment of this disclosure.

FIG. 8A illustrates a circuit diagram of the current multiplier 625 according to one embodiment of this disclosure. For this embodiment, the current multiplier 625 comprises two transistors 805 and 810, an operational amplifier 815, two diodes 820 and 825, and three current sources 830, 835 and 840.

The current multiplier 625 is operable to multiply the thermal current 645 ($I_T$, which is provided by current source 830) and the input current 655 ($I_V$, which corresponds to the collector current of transistor 805) to generate an output current 660 ($I_{out}$, which corresponds to the collector current of transistor 810) as follows:

$$V_{be,out} + V_{be,0} = V_{be,T} + V_{be,V}$$

$$V_T \ln(I_{out}/I_s) + V_T \ln(I_0/I_s) = V_T \ln(I_T/I_s) + V_T \ln(I_V/I_s)$$

$$\Rightarrow I_{out} = I_T \cdot I_V / I_0,$$

where $V_{be,out}$ is the base-emitter voltage for transistor 810, $V_{be,0}$ is the voltage drop across diode 825, $V_{be,T}$ is the voltage drop across diode 820, $V_{be,V}$ is the base-emitter voltage for transistor 805, and $I_0$ is the current provided by current source 840.

Figure 8B:
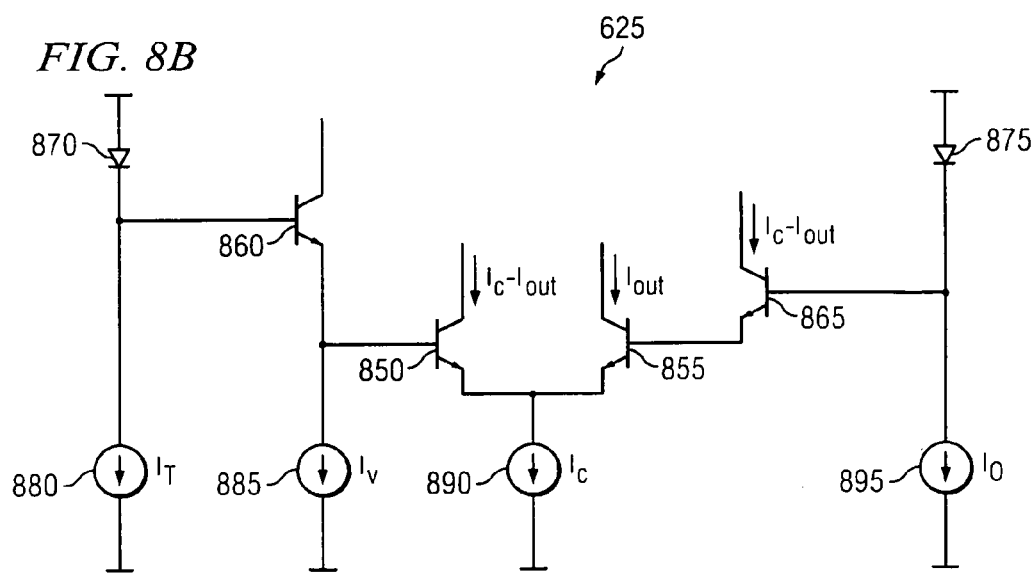
FIG. 8B illustrates a circuit diagram of the current multiplier of FIG. 6 according to another embodiment of this disclosure.

FIG. 8B illustrates a circuit diagram of the current multiplier 625 according to another embodiment of this disclosure. For this embodiment, the current multiplier 625 comprises four transistors 850, 855, 860 and 865, two diodes 870 and 875, and four current-sources 880, 885, 890 and 895. Using transistors 850 and 855 as a differential circuit in this manner allows the current multiplier 625 to be implemented without an operational amplifier.

This current multiplier 625 is operable to multiply the thermal current 645 ($I_T$, which is provided by current source 880) and the input current 655 ($I_V$, which is provided by current source 885) to generate an output current 660 ($I_{out}$, which corresponds to the collector current of transistor 855) as follows:

$$I_T \cdot I_V (I_C - I_{out}) = I_{out}(I_C - I_{out}) \cdot I_0$$

$$\Rightarrow I_{out} = I_T \cdot I_V / I_0,$$

where $I_c$ is the current provided by current source 890 and $I_0$ is the current provided by current source 895.

Figure 9:
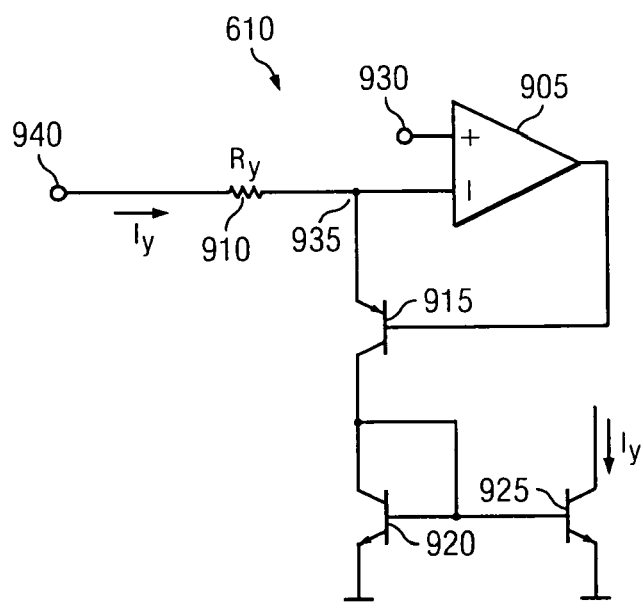
FIG. 9 illustrates a circuit diagram of the voltage-to-current converter of FIG. 6 according to one embodiment of this disclosure.

FIG. 9 illustrates a circuit diagram of the voltage-to-current converter 610 according to one embodiment of this disclosure. For this embodiment, the voltage-to-current converter 610 comprises an operational amplifier 905, a resistor 910, and three transistors 915, 920 and 925. The operational amplifier 905 comprises a positive terminal 930 and a negative terminal 935, and the resistor 910 is coupled between a node 940 and the negative terminal 935 of the operational amplifier 905. The current, $I_y$, through the resistor 910 is provided by the following equation:

$$I_y = V_T \ln(m/n)/R_y,$$

where $R_y$ is the resistance provided by the resistor 910 and the values m and n correspond to the m and n illustrated in FIG. 7A or 7B.

The voltage across the positive terminal 930 of the operational amplifier 905 and the node 940 corresponds to the voltage, $V_y$, illustrated in FIG. 7A or 7B. Thus, for FIG. 7A, the positive terminal 930 is coupled to the base of transistor 720 and the node 940 is coupled to the base of transistor 705. Similarly, for FIG. 7B, the positive terminal 930 is coupled to the base of transistor 755 and the node 940 is coupled to the base of transistor 750.

The voltage-to-current converter 610 is operable to convert the thermal voltage 640 ($V_T$, which is provided by way of the voltage $V_y$) into the thermal current 645 ($I_T$, which is provided by way of the collector current, $I_y$, of transistor 925).

Figure 10:
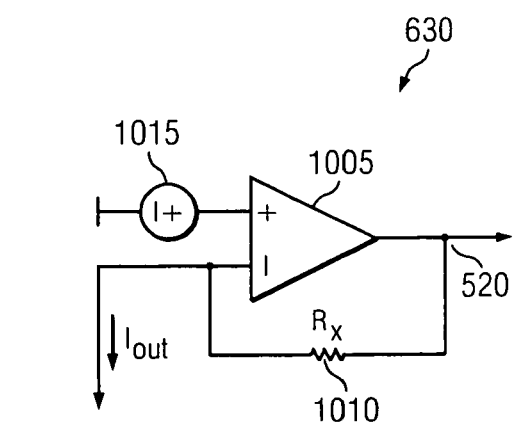
FIG. 10 illustrates a circuit diagram of the current-to-voltage converter of FIG. 6 according to one embodiment of this disclosure.

FIG. 10 illustrates a circuit diagram of the current-to-voltage converter 630 according to one embodiment of this disclosure. The current-to-voltage converter 630 comprises an operational amplifier 1005, a resistor 1010, and a voltage source 1015.

The current-to-voltage converter 630 is operable to convert the output current 660 ($I_{out}$) generated by the current multiplier 625 into the temperature-compensated control signal 520. For the embodiment in which the voltage-to-current converter 610 illustrated in FIG. 9 is used, the resistor 1010 tracks the resistor 910 in order to minimize mismatch errors.

For this embodiment of the current-to-voltage converter 630, the temperature-compensated control signal 520 ($V_{out}$) is provided by the following equation:

$$V_{out} = I_{out} \cdot R_x,$$

where $R_x$ is the resistance provided by the resistor 1010.

Figure 11:
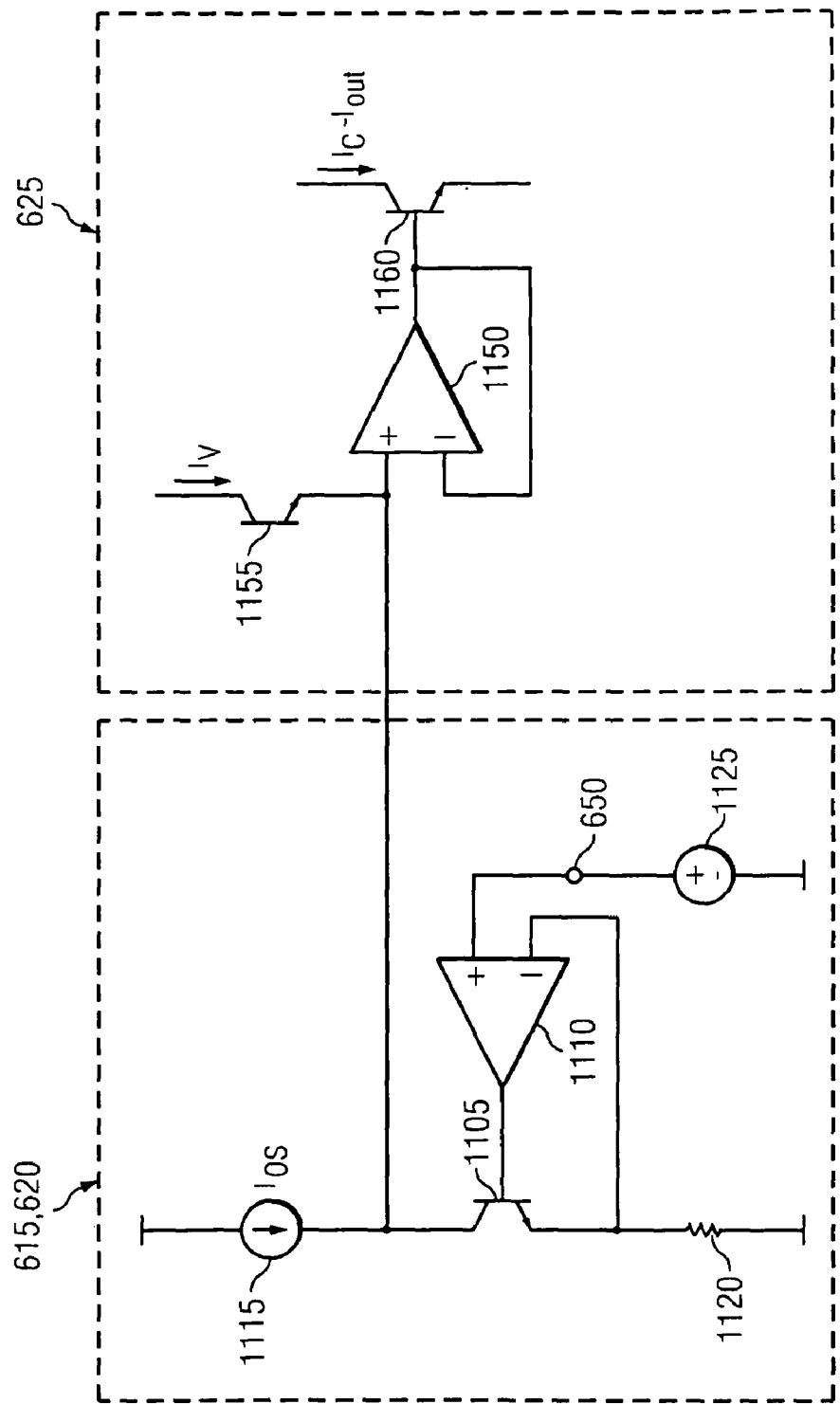
FIG. 11 illustrates a circuit diagram of the input circuit, the voltage-to-current converter and the current multiplier of FIG. 6 according to one embodiment of this disclosure.

FIG. 11 illustrates a circuit diagram of the input circuit 615, the voltage-to-current converter 620, and a portion of the current multiplier 625 according to one embodiment of this disclosure. For this embodiment, the input circuit 615 and the voltage-to-current converter 620 comprise a transistor 1105, an operational amplifier 1110, a current source 1115, a resistor 1120 and a voltage source 1125. The portion of the current multiplier 625 illustrated comprises an operational amplifier 1150 and two transistors 1155 and 1160.

The voltage source 1125 is operable to generate the adjusted constant control signal 650 by applying an offset voltage ($V_{os}$) to the constant control signal 515 ($V_V$) such that the adjusted constant control signal 650 is equal to $V_{os} + V_V$. The current source 1115 is operable to provide an offset current ($I_{os}$). Thus, by adjusting the offset voltage and the offset current, the input circuit 615 is operable to define a starting point for gain control for the temperature compensation control circuit 510.

The input circuit 615 and voltage-to-current converter 620 are operable to generate the input current ($I_V$) 655 as the collector current for the transistor 1155 of the current multiplier 625. As described above, the current multiplier 625 is operable to multiply the input current 655 by the thermal current 645 to generate the output current 660. The operational amplifier 1150 provides a buffer to prevent leakage current when no input voltage is provided.

FIG. 12 illustrates a method for generating a temperature-compensated control signal 520 using the temperature compensation control circuit 510 according to one embodiment of this disclosure. The method begins at step 1205 where the thermal voltage generator 605 generates a thermal voltage 640. For a particular embodiment, the thermal voltage generator 605 generates the thermal voltage 640 by multiplying current ratios of two differential pairs of transistors, across which the total voltage drop is $V_T \cdot \ln(m/n)$. Thus, the device sizes m and n may be chosen to provide a positive or negative voltage drop based on the corresponding application.

At step 1210, the voltage-to-current converter 610 converts the thermal voltage 640 into a thermal current 645. At step 1215, the input circuit 615 receives a constant control signal 515. At step 1220, the input circuit 615 generates an adjusted constant control signal 650 based on the constant control signal 515. For example, the input circuit 615 may provide a voltage offset and/or a current offset to the constant control signal 515 in order to generate the adjusted constant control signal 650.

At step 1225, the voltage-to-current converter 620 converts the adjusted constant control signal 650 into an input current 655. At step 1230, the current multiplier 625 multiplies the thermal current 645 and the input current 655 to generate an output current 660. For a particular embodiment, the current multiplier 625 may generate an output current 660 that is equal to the thermal current 645 multiplied by the input current 655 and divided by another current, $I_0$. At step 1235, the current-to-voltage converter 630 converts the output current 660 into a temperature-compensated control signal 520, at which point the method comes to an end. In this way, a temperature-compensated control signal 520 may be generated that is operable to cause the variable gain amplifier 505 to function independently of temperature.

FIG. 13 illustrates an automatic gain control system 1300 that is capable of varying the gain of a variable gain amplifier 1305 exponentially with respect to a temperature-compensated control signal based on a modified version of that control signal received from a gain control circuit 1310 according to one particular embodiment of this disclosure. For a particular embodiment, the automatic gain control system 1300 may be implemented in a transmit path of a communication system. However, it will be understood that the automatic gain control system 1300 may be implemented in any other suitable system without departing from the scope of the present disclosure.

In addition to the variable gain amplifier 1305 and the gain control circuit 1310, the automatic gain control system 500 comprises a temperature compensation control circuit 1315. The temperature compensation control circuit 1315 is operable to receive a constant control signal 1320 and to generate a temperature-compensated control signal 1325 based on the constant control signal 1320 in order to cause the variable gain amplifier 1305 to function independently of temperature.

The gain control circuit 1310, which is coupled to the temperature compensation control circuit 1315, is operable to receive the temperature-compensated control signal 1325 and to generate a final control signal 1330 based on the temperature-compensated control signal 1325 in order to exponentially vary the gain of the variable gain amplifier 1305. The variable gain amplifier 1305, which is coupled to the gain control circuit 1310, is operable to receive a variable gain amplifier (VGA) input signal 1335 and to generate a VGA output signal 1340 by amplifying the VGA input signal 1335 based on the final control signal 1330. However, the gain of the variable gain amplifier 1305 varies exponentially with respect to the temperature-compensated control signal 1325 instead of with respect to the final control signal 1330.

For the illustrated embodiment, the variable gain amplifier 1305, the gain control circuit 1310 and the temperature compensation control circuit 1315 are part of an automatic gain control system 1300 that also comprises an amplifier 1350, a detector 1355, a filter 1360, and a differential amplifier 1365. However, it will be understood that the variable gain amplifier 1305, the gain control circuit 1310 and the temperature compensation control circuit 1315 may be implemented in a differently arranged automatic gain control system or in any other suitable system without departing from the scope of the present disclosure.

For this embodiment, the amplifier 1350 is coupled to the variable gain amplifier 1305 and is operable to further amplify the VGA output signal 1340 in order to generate a system output signal 1375 that is at a higher level than the VGA output signal 1340 for use in an application in which the automatic gain control system 1300 is implemented. The detector 1355, which is coupled to the amplifier 1350, is operable to detect one or more parameters associated with the system output signal 1375, such as amplitude, carrier frequency, modulation index or the like, and to generate a detected parameter signal 1380 based on the detection.

The filter 1360, which may comprise a low-pass or other suitable filter, is coupled to the detector 1355 and is operable to filter out any undesired components to generate a filtered signal 1385. The differential amplifier 1365 is coupled to the filter 1360 and is operable to compare the filtered signal 1385 to a reference signal 1390 in order to generate the constant control signal 1320.

The temperature compensation control circuit 1315, which is coupled to the differential amplifier 1365, may then generate the temperature-compensated control signal 1325 based on the constant control signal 1320, and the gain control circuit 1310 may exponentially vary the gain of the variable gain amplifier 1305 with respect to the temperature-compensated control signal 1325 using the final control signal 1330. The gain control circuit 1310 is operable to generate the final control signal 1330 in such a manner as to maximize the ability of the variable gain amplifier 1305 to vary its gain exponentially (i.e., in a linear-in-dB fashion) with respect to the temperature-compensated control signal 1325.

It may be advantageous to set forth definitions of certain words and phrases used in this patent document. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, or software, or a combination of at least two of the same. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A gain control circuit, comprising:
   a first transistor having a collector, a base and an emitter, the collector of the first transistor operable to generate an output current;
   a second transistor having a collector, a base and an emitter, the second transistor forming a differential pair with the first transistor, the emitter of the first transistor coupled to the emitter of the second transistor;
   a current-controlled voltage source coupled to the base of the first transistor;
   a third transistor having a collector, a base and an emitter, the third transistor matched to the second transistor, the emitter of the third transistor coupled to the current-controlled voltage source;
   a current mirror coupled to the collector of the second transistor and to the collector of the third transistor;
   an input current source coupled to the emitter of the first transistor; and
   the gain control circuit operable to receive a primary control signal at the base of the second transistor and the base of the third transistor and to generate a secondary control signal at the base of the first transistor and the base of the second transistor.

2. The gain control circuit of claim 1, the current-controlled voltage source comprising a fourth transistor and an operational amplifier.

3. The gain control circuit of claim 1, the current mirror comprising a first current mirror comprising two transistors, a second current mirror comprising two transistors, and a third current mirror comprising three transistors.

4. The gain control circuit of claim 1, the secondary control signal operable to be coupled to a base of a first transistor in a variable gain amplifier and to a base of a second transistor in the variable gain amplifier.

5. The gain control circuit of claim 1, wherein the third transistor is biased in an opposite direction from the second transistor.

6. The gain control circuit of claim 5, wherein the third transistor is biased such that the generated output current equals the input current source when an input voltage is zero.

7. The gain control circuit of claim 1, wherein the current-controlled voltage source is coupled to the current mirror.

8. A gain control device, comprising:
   a differential pair operable to generate an output current, the differential pair comprising a first transistor and a second transistor;
   a current-controlled voltage source coupled to the differential pair;
   a third transistor coupled to the current-controlled voltage source, the third transistor matched to one of the first and the second transistors in the differential pair;
   a current mirror coupled to the collector of the second transistor and to the collector of the third transistor;
   an input current source coupled to differential pair; and
   the gain control circuit operable to receive a primary control signal at a base of each of the matched transistors and to generate a secondary control signal at a base of the first transistor and a base of the second transistor.

9. The gain control device of claim 8, the current-controlled voltage source comprising a fourth transistor and an operational amplifier.

10. The gain control device of claim 8, the current mirror comprising a first current mirror comprising two transistors, a second current mirror comprising two transistors, and a third current mirror comprising three transistors.

11. The gain control device of claim 8, the secondary control signal operable to be coupled to a base of a first transistor in a variable gain amplifier and to a base of a second transistor in the variable gain amplifier.

12. The gain control device of claim 8, wherein the third transistor is biased in an opposite direction from the second transistor.

13. The gain control device of claim 12, wherein the third transistor is biased such that the generated output current equals the input current source when an input voltage is zero.

14. The gain control device of claim 8, wherein the current-controlled voltage source is coupled to the current mirror.

15. A method for controlling gain in a circuit, the method comprising:
receiving a primary control signal across a pair of matched transistors, the matched transistors comprising a first transistor biased in an opposite direction from a second transistor; and
generating, by a differential pair of transistors, a secondary control signal based on the primary control signal, the differential pair of transistors comprising the second transistor and a third transistor.

16. The method of claim 15, generating the secondary control signal comprising generating the secondary control signal across a base of the second transistor and a base of the third transistor.

17. The method of claim 15, further comprising receiving the primary control signal from a differential amplifier.

18. The method of claim 15, further comprising providing the secondary control signal to a variable gain amplifier.

19. The method of claim 15, wherein a base-emitter voltage of the first transistor equals a base-emitter voltage of the second transistor.

20. The method of claim 15, receiving the primary control signal comprising receiving the primary control signal at a base of the first transistor and the base of the second transistor such that the primary control signal drives a base of the second transistor relative to the base of the first transistor.

* * * * *